US005737461A

United States Patent [19]
Sanders et al.

[11] Patent Number: 5,737,461
[45] Date of Patent: Apr. 7, 1998

[54] METHODS AND FILTER FOR ISOLATING UPSTREAM INGRESS NOISE IN A BI-DIRECTIONAL CABLE SYSTEM

[75] Inventors: Stuart Baker Sanders; Vivian Therese Lund, both of Lindenhurst, Ill.

[73] Assignee: Motorola, Inc., Schaumburg, Ill.

[21] Appl. No.: 644,029

[22] Filed: May 9, 1996

[51] Int. Cl.[6] ................................................. G02B 6/34
[52] U.S. Cl. ............................................................ 385/27
[58] Field of Search ................................. 385/16, 27, 143;
359/125, 137; 455/5.1, 1; 348/5.5; 380/52,
4, 10, 20

[56] References Cited

U.S. PATENT DOCUMENTS

| | | | |
|---|---|---|---|
| 5,109,286 | 4/1992 | West, Jr. et al. | 348/5.5 |
| 5,243,647 | 9/1993 | Parikh et al. | 380/4 |
| 5,528,582 | 6/1996 | Bodeep et al. | 359/125 |
| 5,590,173 | 12/1996 | Beasley | 455/460 |
| 5,604,528 | 2/1997 | Edwards et al. | 455/1 |

*Primary Examiner*—Akm E. Ullah
*Attorney, Agent, or Firm*—Jordan C. Powell; Charles D. Gavrilovich, Jr.

[57] ABSTRACT

An upstream ingress filter (300) for isolating upstream ingress noise on a bi-directional cable system having an upstream band and a downstream band for carrying upstream signals and downstream signals, respectively. The upstream ingress filter (300) includes a DC switching element (310) for changing the DC voltage on the cable system at said cable access unit and a switchable notch filter (340) that switches ON and OFF in response to the DC switching element. The notch filter isolates upstream ingress noise by attenuating upstream signals in the upstream band when the upstream ingress filter is ON. Both the DC switching element (310) and the notch filter (340) are connected in parallel to the cable (301).

8 Claims, 2 Drawing Sheets

5,737,461

METHODS AND FILTER FOR ISOLATING UPSTREAM INGRESS NOISE IN A BI-DIRECTIONAL CABLE SYSTEM

BACKGROUND OF THE INVENTION

The present invention relates, in general, to telecommunication systems, and more particularly to isolating upstream ingress noise in a bi-directional cable system.

Cable communication infrastructures typically comprise a hub servicing various nodes, such that one or more nodes are at the end of each spoke of the hub. Spokes are typically fiber optic cable. The fiber optic cable leads to a distribution portion of coaxial cable extending to individual subscribers such as homes, businesses, etc. The distribution portion at the end of a particular spoke is often divided into manageable subsets, for example 20 kilometer radius subsets, which are the individual nodes. The nodes typically include one or more subscriber drops that connect the individual subscribers to the cable communication system.

Although cable infrastructures are electromagnetically sealed to prevent radio frequency noise from leaking into the cable, leakage can and usually does occur. When the leakage is from outside the cable system into the cable it is called "ingress" noise. Ingress noise can be generated in many ways such as, for example, two-way dispatch services, amateur radio transmission, various commercial, medical, or industrial electronic equipment, as well as ignition noise from combustion engines. Additionally, one very common and troublesome source or ingress noise is electromagnetic emissions at the cable subscriber's premise from electric motors in fans, carpet vacuums, hair dryers and the like. These emissions are often coupled onto the cable system cable via unterminated cable stubs in the subscriber's premise, the stubs tending to act as antennas.

Bi-directional cable communication systems often comprise an upstream band and a downstream band for carrying upstream signals and downstream signals, respectively. Ingress noise can appear in either the upstream or downstream portion of the cable transmission frequency spectrum. Ingress noise may be continuous, intermittent, or sudden, and in the extreme case, catastrophic, rendering the information being transmitted on a particular carrier channel totally unusable. Ingress noise is normally isolated to a relatively narrow band, but a single incidence may cause interference to several carriers in the same subregion of the cable spectrum. Downstream ingress noise may be seen as distortion, snow, or other impairments to the television video or audio signal. Upstream ingress noise is especially troublesome to cable service operators because upstream ingress noise from any individual subscriber drop is additive with upstream ingress noise from other subscribers on the same cable branch. The ingress noise discussed above which results from electromagnetic emissions at the subscriber's premise is a significant source of this upstream ingress noise. It is desirable for a cable operator to be able to isolate (shut off) this sort of upstream ingress noise while minimally disturbing service to the subscriber premise which is the source of the noise. With the capability of isolating each particular subscriber premise noise, the cable operator can identify any chronic noise source subscriber and take corrective measures.

There are presently at least two methods currently used by cable operators to isolate sources of ingress noise emanating from a subscriber's premise. When the signal is separated into upstream and downstream portions of the spectrum, one method requires that a diplex filter be installed at the point of the subscriber's access to the cable (sometimes refered to as a cable access unit) to physically separate the upstream and downstream bands onto two separate lines. Once the upstream and downstream paths are physically separate, a switch is connected in series with each line. In order to determine whether ingress noise is leaking into the upstream portion, the upstream switch is engaged to form an open circuit, effectively removing that cable access unit from the cable infrastructure so that a noise, or ingress, measurement can be made. If the level of upstream ingress noise is substantially reduced upon the removal of that cable access unit from the infrastructure, the source of ingress has been isolated. One disadvantage of this approach is that the diplex filter must be installed in series with the subscriber signal path. The use of serial filters, however, degrades the upstream and downstream signals and adds to the return and insertion losses of the system. Also, because switches normally fail open, failure of the serial switches in the cable access unit normally causes a total loss of cable service in the respective line, contributing to the unreliability of the cable service.

Another disadvantage of physically splitting the upstream and downstream bands by using a serial diplex filter is that reallocation of spectrum is precluded. For example, a bi-directional cable system may have an upstream band comprising frequencies between 5 and 42 MHz, a downstream band comprising frequencies between 50 and 750 MHz, and a guard band comprising frequencies between 42 and 50 MHz. In such a system, extension of the upper limit of the upstream band to a frequency of 45 MHz, would be impossible, unless the original diplex filter is replaced with a diplex filter with the appropriate attenuation characteristics. Therefore, spectrum reallocation is precluded when the upstream and downstream signals are physically split onto separate lines because upstream and downstream frequency allocation via a diplex filter is fixed.

Another approach for isolating sources of ingress noise is to install a fixed attenuator in series with the subscriber path that is engaged to make ingress noise measurements. Because this approach avoids the use of a diplex filter, the reallocation problem discussed above is avoided. However, the placement of switches in series with the cable nevertheless: (a) decreases the reliability of the cable service due to occasional switch failure and (b) degrades the signal-to-noise ratio. Furthermore, upstream ingress noise measurements made by opening serial switches disrupt downstream transmission. Such disruptions are known to be a major cause of customer dissatisfaction.

Therefore, it would desirable to isolate ingress on a cable communication system without increasing return and insertion losses, and without decreasing the reliability of the cable service.

DETAILED DESCRIPTION OF THE DRAWINGS

Generally, the present invention provides methods and apparatus for evaluating ingress noise on a cable system.

More specifically, the scope of the methods and apparatus of the present invention is particularly suited for isolating upstream ingress noise on a bi-directional cable system by attenuating upstream ingress noise originating from a subscriber premise via a cable access unit.

A preferred embodiment of the present invention, as explained in greater detail below, comprises a DC switching element for changing the DC voltage on the subscriber path and a switchable notch filter responsive to the DC switching element for making an upstream ingress noise measurement. In accordance with the principles of the present invention, the DC switching element and the switchable notch filter are connected in parallel to the cable.

Figure 1:
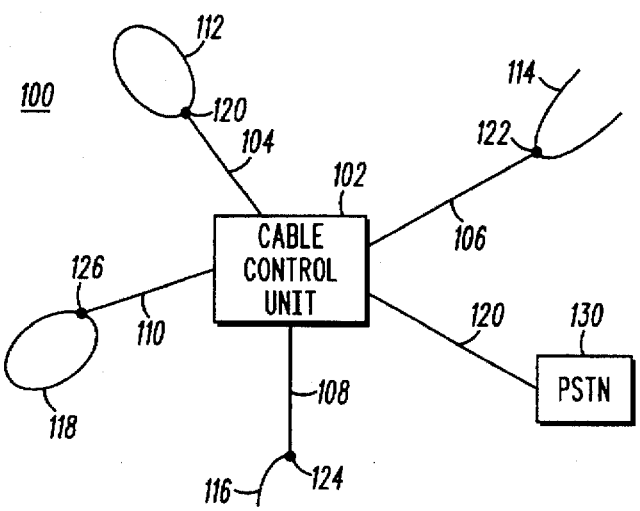
FIG. 1 is a schematic diagram of a telecommunication system using a cable communication infrastructure.

Turning to the figures for a more detailed understanding of the principles of the present invention, FIG. 1 shows a schematic overview of a cable communication infrastructure configured for two way communications such as, for example, the placement of telephone calls or the bi-directional transmission of computer data. Referring to FIG. 1, telecommunication system 100 consists of a cable control unit 102 (CCU). The cable control unit 102 serves to receive and actively route signals (i.e., information) throughout the system 100, as well as to carry out other system administration functions.

Extending from the cable control unit 102 (i.e., hub) are several spokes 104, 106, 108 and 110, which are preferably fiber optic cables. The spokes 104–110 may be of other suitable transmission medium, such as low-loss coaxial cable, depending upon the particular application, topography and system requirements. The spokes 104–110 serve as "trunks" for the telecommunication system 100, as is readily apparent to persons skilled in art.

The fiber optic spokes 104–110 each lead to a particular one of the distribution portions 112, 114, 116 and 118, respectively. Each one of the distribution portions 112–118 is located at the end of the corresponding one of the spokes 104–110, each of which effectively terminates at one of the distribution points 120, 122, 124 and 126, respectively. Typically, the distribution portions 112–118 consist of coaxial cable, rather than fiber optic cable, that distributes signals to and from individual subscribers, as is shown in more detail in FIG. 2.

The distribution portions 112–118 are shown in a variety of representative configurations in order to illustrate that such variety may be employed. For example, the distribution portion 112 is shown as a loop, whereas distribution portions 114 and 116 are shown as varying stubs. Thus, the specific configuration selected for each distribution portion is not considered to be a limiting factor of the present invention.

In addition to distribution portions, cable control unit 102 may also be connected to other communication systems via gateways. For example, a spoke 128 extends from control unit 102 to a Public Switched Telephone Network (PSTN) 130. The spoke 128 can be a fiber optic cable similar to the spokes 104–110, or spoke 128 may be any other suitable transmission medium that is known to persons skilled in the art. Thus, the communication system 100 may be utilized to access all commonly available communications networks via cable 128 and various gateways, such as PSTN 130.

Figure 2:
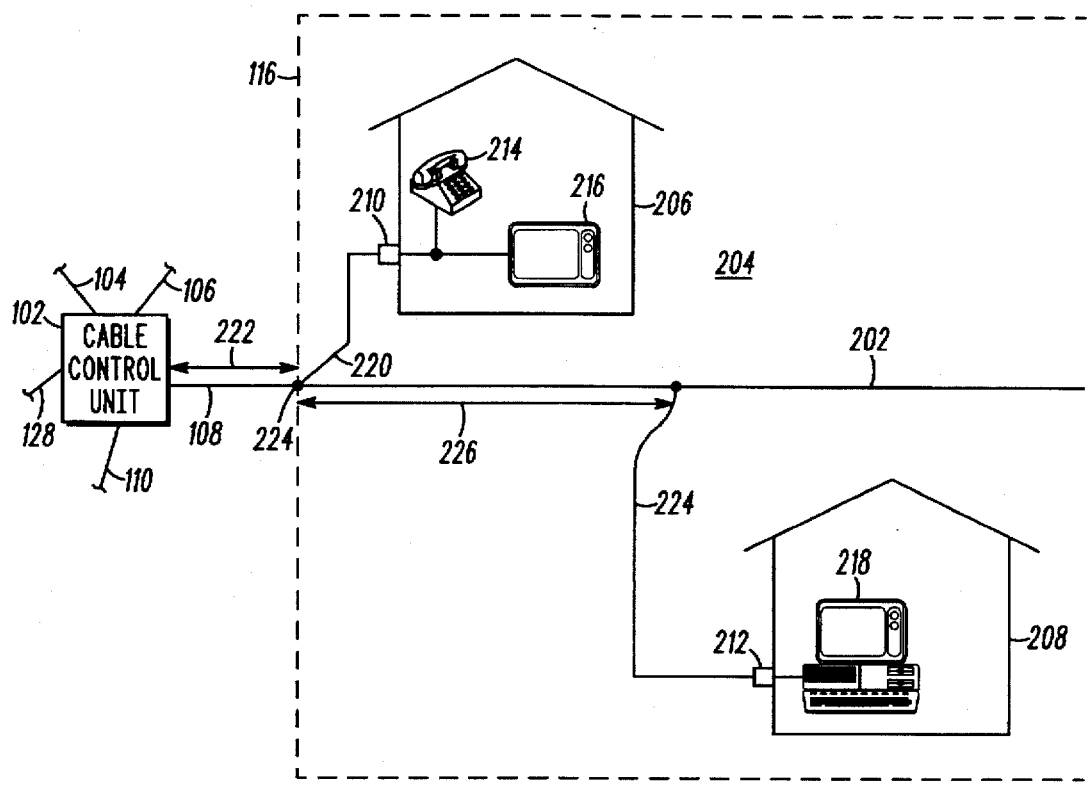
FIG. 2 is a schematic diagram of a single node of the telecommunication system shown in FIG. 1.

FIG. 2 is a schematic diagram of a portion of telecommunication system 100 that provides a detailed illustration of a cable communication infrastructure set up for bi-directional communications. In particular, the principles of the present invention may be applied to enable a cable operator to isolate ingress noise to a single cable access unit within a given distribution portion. For purposes of illustration, distribution portion 116 is shown in FIG. 2, although the principles are equally applicable to all distribution portions.

Cable access units 210 and 212, used in connection with communication system 100, are single transceiver devices that act as interfaces between cable control unit 102 and subscriber appliances (such as telephone 214, television 216, and computer 218). Cable access units, which code and decode between analog and digital signals, are normally mounted on the side of subscriber homes 206 and 208, or in some other unobtrusive place, such as a basement or attic. Cable access units 210 and 212 may also be directly incorporated into subscriber appliances, such as televisions, computers, and telephones for use with the principles of the present invention.

Bi-directional cable systems using cable access units 210 and 212 usually comprise two bands of operation—an upstream band and a downstream band for carrying upstream signals and downstream signals, respectively. The upstream band provides uplink communication for transmitting information from cable access units 210 and 212 (i.e., the tailends of the system) to cable control unit 102 (i.e., the headend of the system). The upstream band may include frequencies, for example, between about 5 MHz and about 42 MHz. Similarly, the downstream band provides downlink communication for transmitting information from the headend to the tailends of the cable system. The downstream band may include frequencies, for example, between about 50 MHz and about 750 MHz. Finally, a non-operative band, referred to as a guard band, is typically located between the upstream and downstream bands to prevent interference between the operative bands.

In typical cable environments, the downstream consists of approximately 100 6 MHz channels, each containing video programming. These downstream channels are usually located in the 50 MHz–750 MHz band. When telephony and data communications capability is added to the system, as is consistent with the present invention, a portion of one or more of the 6 MHz video channels may be dedicated to telephony/data channels which have associated carriers, typically spaced 600 KHz apart.

The typical upstream spectrum in a two-way cable system is 5 MHz–42 MHz. In the past, this upstream has been used for simple, low data rate traffic of set-top box status, pay-per-view requests, etc. When telephony and data communications capability is added to the system, as is consistent with the present invention, telephony/data channels having associated carriers are provided in this spectrum, typically spaced 600 KHz apart.

The cable communication system, used in accordance with this invention, should have frequency agility—namely, the ability to move carriers to different channels in either the uplink and/or downlink direction. Frequency agility can be used to move a carrier to a new RF channel that is not affected by ingress noise.

Figure 3:
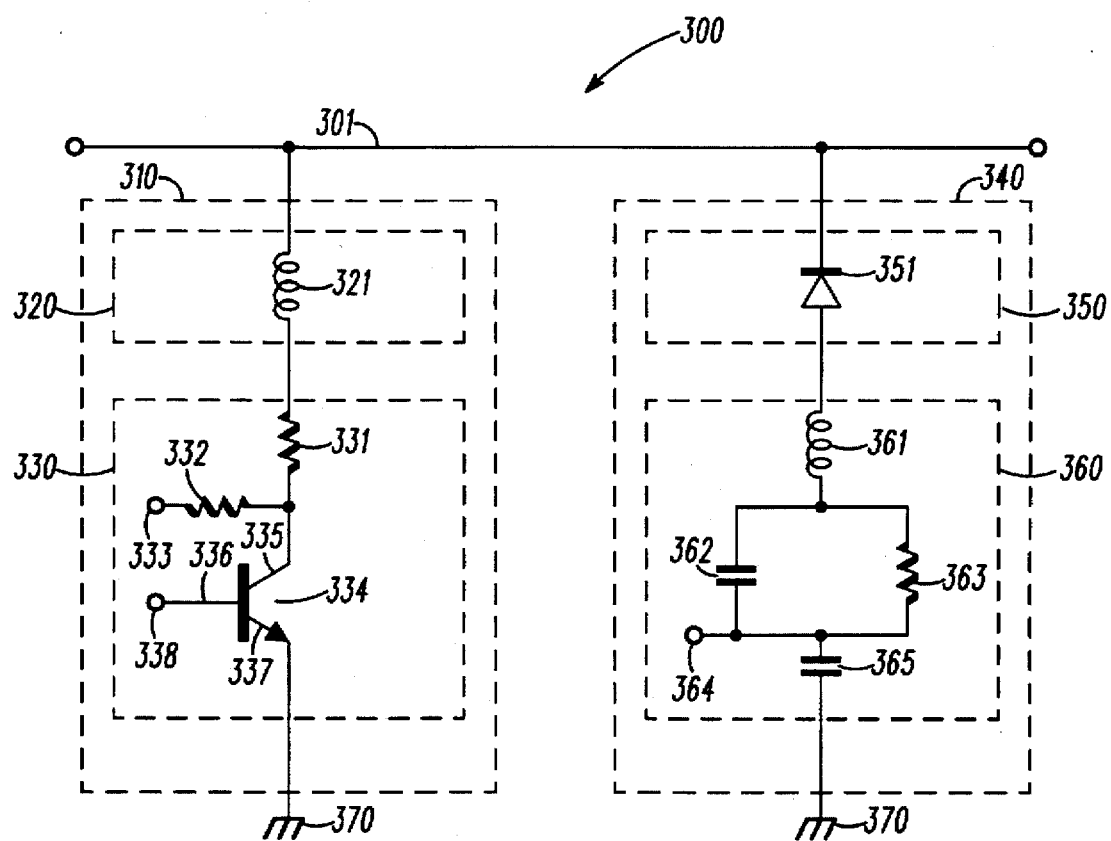
FIG. 3 is a diagram of an ingress isolation circuit constructed in accordance with the principles of the present invention.

As shown in FIG. 3 and in accordance with the principles of the present invention, upstream ingress filter 300 may be used to isolate upstream ingress noise. Upstream ingress filter 300 includes (1) DC switching element 310 for changing the DC voltage on subscriber signal path 301 and (2) switchable notch filter 340 which is responsive to DC switching element 310 for isolating upstream ingress noise. Both DC switching element 310 and switchable notch filter 340 are connected in parallel with subscriber signal path 301. Preferably, DC switching element 310 comprises two serial elements: upstream choke 320 and switch assembly 330. Upstream choke 320 may be activated by switch assembly 330. When switch assembly 330 is activated, upstream choke provides: (1) a low-independence path to ground 370 for a first predetermined range of frequencies and (2) a high-impedance path for a second predetermined range of frequencies. The first predetermined range of frequencies preferably includes frequencies substantially less than the lower frequency limit of the upstream frequency band, and most preferably 0 Hz (e.g., DC voltages). The second predetermined range of frequencies preferably includes frequencies which are about equal to or greater than the lower limit of the upstream frequency band. Most preferably, the second predetermined range of frequencies includes the frequencies between about the lower limit of the upstream frequency band and about the upper limit of the downstream frequency band.

As shown in FIG. 3, switch assembly 330 preferably includes transistor 334 and DC source 338 for biasing transistor 334. Transistor switch assembly 330, such as the one shown in FIG. 3, (a) enables very rapid switching (i.e., typically within a fraction of a microsecond), (b) allows many different circuits to be switched with a single control signal, and (c) permits "cold switching" in which only dc control voltages are transmitted to a switch assembly rather than information containing signals that are susceptible to capacitive pickup and signal degradation. Preferably, transistor 334 is a field effect transistor (FET) having collector 335, base 336, and emitter 337. In the embodiment shown in FIG. 3, the transistor is "inactive" when the base voltage is low. When inactive, there is no base current and therefore no collector current in transistor 334. Therefore, when the base voltage is low, upstream choke 320 is off. On the other hand, when the base voltage is high, transistor 334 is turned "on," permitting current to flow between collector 335 and emitter 337 and thereby providing a low-impedance path to ground 370 for upstream choke 320 and signal path 301.

In order to prevent damage to DC switching element 330 when the ingress filter 300 is "on," switch assembly 330 also preferably includes resistors 331 and 332. Resistor 332 limits electrical current flowing between DC source 333 and ground 370 when transistor 334 is providing a low-impedance path to ground 370. Resistor 332 should have a resistance between about 1 kilo-Ohms and about 10 Mega-Ohms, and preferably should have a resistance of about 10 kilo-Ohms. Additionally, DC switching element 310 preferably includes resistor 331 connected in series with choke 320 and transistor 334 for limiting electrical current when transistor 334 provides a low-impedance path to ground 370. Resistor 331 should have a resistance between about 100 Ohms and about 10 kilo-Ohms, and preferably has a resistance of about 470 Ohms. DC source 333 is preferably a 12 volt DC power supply, but need only be sufficient to drive transistor 334.

Switchable notch filter 340, shown in FIG. 3, preferably comprises switch 350 connected in series with broad-band notch filter 360. Switch 350 is preferably a voltage-variable resistor, such as PIN diode 351. Preferably, PIN diode 351 is Model #MA4P274, available from MA-COM, Inc., of Lowell, Mass. Broad-band notch filter 360 may be any circuit which effectively attenuates at least a portion of the upstream band. More particularly, broad-band notch filter 360 preferably has a relatively low Q-factor (i.e., Q-factor scales inversely with the band width of broad-band notch filter 360). Preferably, broad-band notch filter 360 includes inductor 361 connected in series with capacitor 365, as well as capacitor 362 and resistor 363 that are connected in parallel with each other and in series with inductor 361 and capacitor 365.

Capacitor 362 should have a capacitance between about 500 pico-Farads and about 2,000 picoFarads, and preferably has a capacitance of about 1000 pico-Farads. Capacitor 365 should have a capacitance between about 1,000 pico-Farads and about 1 micro-Farad, and preferably has a capacitance of about 0.1 micro-Farads. Inductor 361 should have an inductance between about 220 nano-Henrys and about 50 nano-Henrys, and preferably has an inductance of about 100 nano-Henrys. Resistor 363 should have a resistance between about 2 Ohms and about 1 kilo-Ohms, and preferably has a resistance of about 12 Ohms. Switchable notch filter 340 also preferably includes a DC source 364 which reverse biases PIN diode 351 when transistor 334 is off. DC source 364 is preferably a 5 volt DC power supply, but need only have a voltage sufficient to forward bias PIN diode 351 when filter 300 is active. It should be readily apparent to persons of ordinary skill in the art that broad-band notch filter 360 may be any band-reject filter that attenuates upstream frequencies without strongly attenuating downstream frequencies.

When transistor 334 is "on," the dc voltage on subscriber signal path 301 is lowered by choke 320. Preferably, choke 320 is any broad band choke capable of providing a low-impedance path to ground for a first predetermined range of frequencies when the choke is active. Moreover, choke 320 preferably provides a high-impedance path to ground for substantially all frequencies in the upstream and downstream bands. Preferably, choke 320 is the shunt leg of a directional coupler 321, such as Model #EMDC-10-1-75, available from MA-COM, Inc., of Lowell, Mass. When the dc voltage on subscriber signal path 301 is sufficiently low, PIN diode 351 is forward biased, providing a low-impedance path to ground 370 through broad-band notch filter 360 for signals and/or ingress in the upstream band. The low-impedance path to ground 370 prevents upstream signals and/or ingress that originate at or near cable access units 210 and 212 from affecting cable control unit 102. Thus, local sources of upstream ingress noise can be isolated from cable system 100 by activating, or turning on, one or more upstream ingress filters.

There are several methods of isolating sources of ingress noise on a bi-directional cable system in accordance with the principles of the present invention. Generally, sources of upstream ingress noise on a cable infrastructure 100 may be isolated by activating an upstream ingress filter. Activating upstream ingress filter 300 prevents ingress noise associated with cable access unit 210 or 212 from being transmitted to cable control unit 102. Once upstream ingress filter 300 is active, a first upstream ingress measurement can be made. An upstream ingress noise measurement is the determination of the ingress level at a particular frequency or range of frequencies. By comparing the first ingress level measurement made when filter 300 is on to the upstream ingress level measurement made when filter 300 is off, it can be determined whether or not the subscriber premise associated with that particular cable access unit is a substantial source of ingress noise. If the upstream ingress level measurement decreases upon activation of upstream ingress filter 300, it can be determined that the particular subscriber premise is a source of ingress noise. Alternatively, if the ingress level measurement does not decrease when upstream ingress filter 300 is activated, it can be determined that the particular subscriber premise is not a source of ingress noise.

In accordance with the principles of the present invention, ingress noise measurements are made by activating upstream ingress filter 300 remotely or locally. Preferably, ingress measurements are made remotely. Remote activation may be in response to a downstream activation signal transmitted by cable control unit 102 and received by one or more cable access units on cable infrastructure 100. Preferably, cable control unit 102 periodically transmits downstream activation signals to periodically activate one or more upstream ingress filters. By periodically activating one or more upstream ingress filters and simultaneously monitoring the ingress noise level at cable control unit 102 for corresponding drops in ingress noise, sources of ingress noise may be determined.

Periodic activation is especially useful for performing general maintenance-like functions on cable system 100, such as the automatic detection of unacceptable sources of ingress noise. For example, to automatically detect unacceptable sources of ingress noise, previous ingress noise measurements of known quality can be made and the ingress noise levels stored for subsequent analysis. Previous ingress measurements of known quality may be analyzed to determine a threshold level, above which ingress is considered to have an unacceptable level. Once a threshold level is determined, ingress measurements are periodically made and compared to the threshold. Alternatively, an upstream ingress source may be determined to be present if the first upstream ingress level is found to be sufficiently similar to a previous ingress measurement known to be indicative of an upstream ingress noise source.

It should be understood that the predetermined threshold level may vary, for example, with carrier frequency and time of day or year. During operation, if the upstream ingress level is determined to be unacceptable, the cable control unit may notify a cable operator that an unacceptable source of ingress noise has been detected. Alternatively, automatic upstream attenuation may be desirable to remove major or even catastrophic sources of ingress. In fact, it should be clear to persons skilled in the art that a number of actions may be taken in response to the isolation of one or more ingress sources on cable system 100.

Moreover, upstream ingress filter 300 may be activated locally by a subscriber or cable maintenance personnel. For example, upstream ingress filter 300 may be engaged by a toggle switch located at the subscriber home or office. Local activation could be used, for example, when remote activation becomes inoperable or undesirable.

A further advantage of the present invention is that upstream ingress filter 300 allows for spectrum reallocation. Spectrum reallocation is the reassignment of portions of the spectrum from one band of operation to another band of operation. For example, consider a bi-directional cable system having an upstream band between 5 MHz and 42 MHz, a guard band between 42 MHz and 50 MHz, and a downstream band between 50 MHz and 750 MHz. In such a system, the cable operator may desire to expand the upper limit of upstream band from 42 MHz to 45 MHz, thereby reducing the bandwidth of the guardband. Because ingress noise generally scales inversely with frequency, most serious sources of ingress noise have a low frequency (i.e., from about 5 MHz to about 22 MHz). Therefore, because upstream ingress filter 300 is designed to strongly attenuate the lower portion of the upstream band, reallocation of a lower portion of the guard band for use as an upstream band does not substantially effect upstream ingress filter utility.

It will be understood that the foregoing is only illustrative of the principles of the invention, and that various modifications can be made by those skilled in the art without departing from the scope and spirit of the invention. For example, the broad-band notch filter may be replaced with a plurality of narrow band notch filters, each of which may be activated by same or different downstream activation signals. In this configuration, different portions of the upstream band could be selectively attenuated. Also, the upstream ingress filter need not be installed exclusively in cable access units. Upstream ingress filters could also be installed regularly along the length of communication infrastructure to isolate ingress noise from points other than cable access units, such as gateways.

Furthermore, the broad-band notch filter, in accordance with the principles of the present invention, may include, for example, a high pass filter and a low pass filter in parallel with one another, wherein the high pass filter provides a low-impedance path for frequencies below a first threshold frequency and the low pass filter provides a low-impedance path for frequencies above a second threshold frequency. When the first threshold frequency is higher than the second threshold frequency, the notch filter provides a low-impedance path between the cable and ground for frequencies between the first threshold frequency and the second threshold frequency.

We claim:

1. A method for isolating upstream ingress noise on a bi-directional cable system comprising a cable control unit, a plurality of cables, and a plurality of cable access units, each one of said plurality of cables having an upstream band and a downstream band for carrying upstream signals and downstream signals, respectively, each one of said plurality of cable access units comprising an associated upstream ingress filter, each of said ingress filters comprising a DC switching element for changing a DC voltage on said one of said plurality of cables and a switchable notch filter responsive to said DC switching element for making an ingress noise measurement, said DC switching element and said switchable notch filter being in parallel to each other and said one of said plurality of cables said method comprising the steps of:

activating at least one of said upstream ingress filters to prevent said upstream signals and any associated ingress noise from being transmitted from said one of said plurality of cable access units;

measuring said upstream ingress noise during said step of activating to determine a first upstream ingress level;

comparing said first upstream ingress level with a predetermined threshold level; and determining whether or not one or more of said plurality of cable access units are responsible for introducing upstream ingress noise to said cable system in response to said step of comparing.

2. The method of claim 1 wherein said step of activating comprises activating one or more of said upstream ingress filters simultaneously.

3. The method of claim 1 wherein said step of activating comprises periodically activating at least one of said upstream ingress filters.

4. The method of claim 1 wherein said step of activating is performed remote from said cable control unit in response to commands from said cable control unit.

5. The method of claim 1 wherein said step of activating is performed locally in response to a switch on said one of said plurality of cable access units.

6. The method of claim 1, wherein said predetermined threshold level is determined from a previous ingress noise measurement having an ingress noise level of acceptable quality.

7. The method of claim 1, wherein said predetermined threshold level is determined from a previous ingress noise measurement having an ingress noise level of unacceptable quality.

8. A method for isolating upstream ingress noise on a bi-directional cable system comprising a cable control unit, a plurality of cables, and a plurality of cable access units, said cable system having an upstream band and a downstream band for carrying upstream signals and downstream signals, respectively, each one of said plurality of cable access units comprising an associated upstream ingress filter, each of said ingress filters comprising a DC switching element for changing a DC voltage on one of said plurality of said cables and a switchable notch filter responsive to said DC switching element, said method comprising the steps of:

activating at least one of said upstream ingress filters to prevent said upstream signals and any associated ingress noise from being transmitted from said one of said plurality of cable access units associated with said at least one of said upstream ingress filters;

measuring said upstream ingress noise subsequent to said step of activating to determine a first upstream ingress level;

comparing said first upstream ingress level with a predetermined threshold level; and determining whether or not one or more of said plurality of cable access units are responsible for introducing upstream ingress noise to said cable system in response to said step of comparing.

* * * * *